United States Patent [19]

Furumochi

[11] Patent Number: 5,896,343
[45] Date of Patent: Apr. 20, 1999

[54] SEMICONDUCTOR MEMORY DEVICE HAVING ADDITIONAL DRIVER CIRCUIT FOR REDUCING SIGNAL PROPAGATION DELAY

[75] Inventor: Kazuto Furumochi, Kawasaki, Japan

[73] Assignee: Fujitsu Limited, Kanagawa, Japan

[21] Appl. No.: 08/914,778

[22] Filed: Aug. 20, 1997

[30] Foreign Application Priority Data

Mar. 13, 1997 [JP] Japan .................................. 9-058766

[51] Int. Cl.$^6$ .................................................. G11C 8/00
[52] U.S. Cl. .................. 365/230.06; 365/189.07; 326/106; 326/108
[58] Field of Search ................ 365/230.06, 233.5, 365/189.07; 326/106, 108

[56] References Cited

U.S. PATENT DOCUMENTS 5,696,731  12/1997  Miyamoto .................. 365/233.5

FOREIGN PATENT DOCUMENTS

2-141822  5/1990  Japan .
4-238191  8/1992  Japan .
8-102492  4/1996  Japan .

Primary Examiner—David Nelms
Assistant Examiner—Andrew Q. Tran
Attorney, Agent, or Firm—Nikaido Marmelstein Murray & Oram, LLP

[57] ABSTRACT

The drive circuit of the present invention includes a signal generation circuit which generates a drive signal at a specific timing. A first driver circuit drives one end of a first wire connected to a plurality of controlled circuits in response to the drive signal. A second driver circuit drives one end of a second wire having a smaller drive load than the first wire in response to the drive signal. A high speed driver circuit has its inputs connected to the other end of the second wire and to the other end of the first wire, and has an output terminal that drives the other end of the first wire when the voltage level at the other end of the second wire does not coincide with the voltage level at the other end of the first wire. By using the second wire as a bypass wire, by providing the drive signals to the high speed driver circuit without any delay, and by having the high speed driver circuit drive the first wire accordingly, it is possible to minimize the propagation delay of the drive signals supplied by the first wire which has a large drive load.

5 Claims, 8 Drawing Sheets

SEMICONDUCTOR MEMORY DEVICE HAVING ADDITIONAL DRIVER CIRCUIT FOR REDUCING SIGNAL PROPAGATION DELAY

BACKGROUND OF THE INVENTION

1. Field of the Invention

The present invention relates to a circuit that drives wires for supplying drive signals that drive a plurality of controlled circuits, and to a semiconductor memory device that makes use of this drive circuit.

2. Description of the Related Art

When a plurality of controlled circuits are to be driven in a semiconductor device, a wire is provided along these plurality of controlled circuits, drive control signals are provided by a driver circuit from one end of this wire, and the plurality of controlled circuits connected to this wire are all driven at once. In this case, particularly when the wire to which the plurality of controlled circuits are connected has a large capacitive load and is driven by a driver circuit connected to one end of the wire, the shape of the drive control signals may be much flatter at the other end of the wire.

Figure 7:
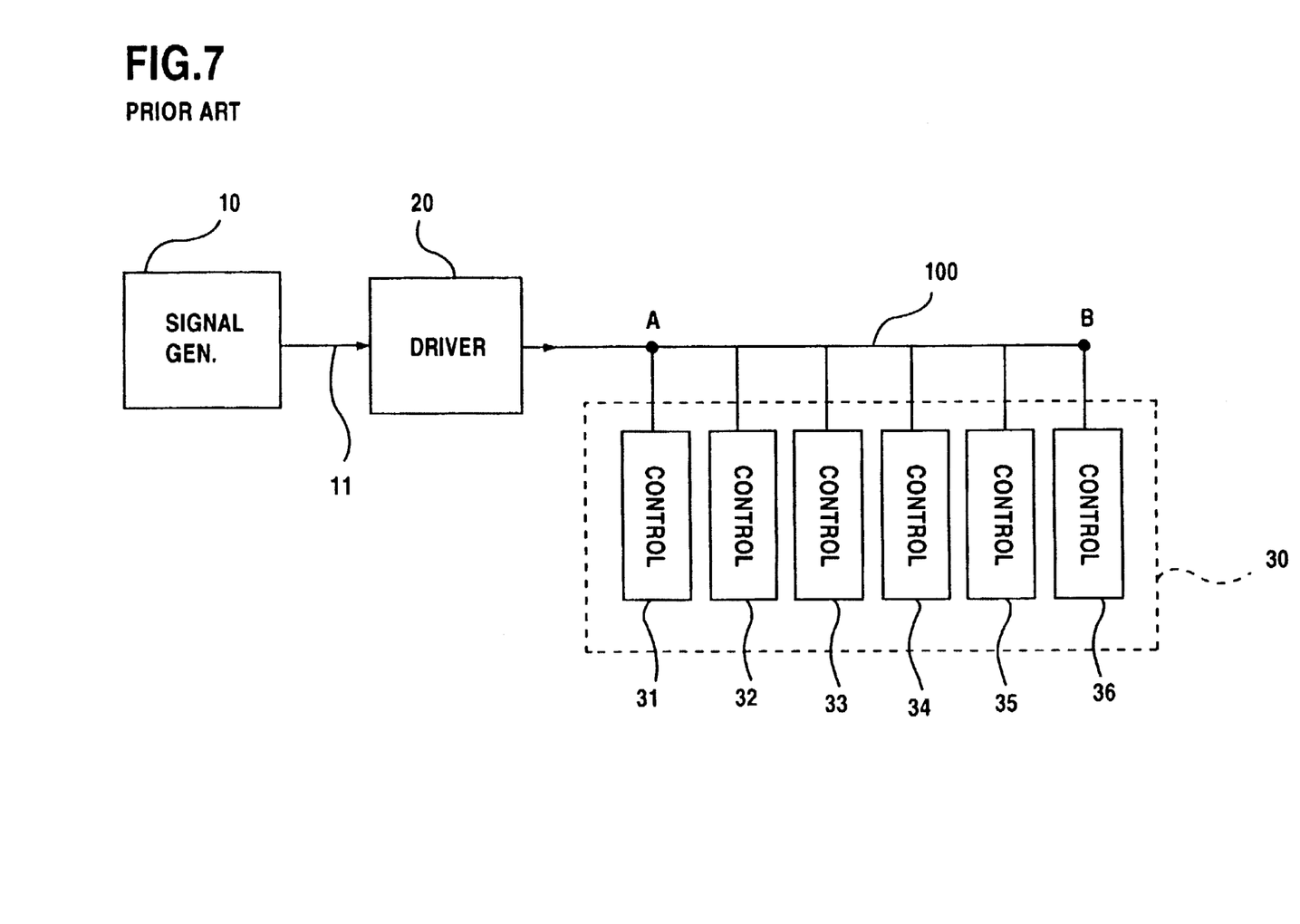
FIG. 7 is a diagram that illustrates a conventional drive circuit.

FIG. 7 is a diagram illustrating an example of a conventional drive circuit. In this example, drive control signal 11 of a signal generation circuit 10 that generates drive control signal is provided to a driver circuit 20, and one end of a wire 100 is driven at the timing of the control signal by the driver circuit 20. The wire 100 supplies the drive control signal to controlled circuits 31 through 36 provided along the wire. The controlled circuits 30 are, for example, given separate input signals that are not depicted, and perform a specific operation all at once at the timing of the drive control signal generated by the generation circuit 10 of the drive control signal.

As semiconductor devices have become more and more highly integrated in recent years, there has been a trend toward making the wire 100 thinner and narrower. In particular, the need for a multilayer construction tends to result in thinner wiring on the lower layer side, while there are limitations imposed on the width of the wiring so that it will not take up too much space. Therefore, the resistance of the wire 100 tends to be greater. Furthermore, when drive control signals are supplied to an extremely large number of the controlled circuits 30, the length of the wire 100 increases and the load capacity of the input terminals of the controlled circuits to which the wire 100 is connected results in the wire 100 having a large drive load.

Figure 8:
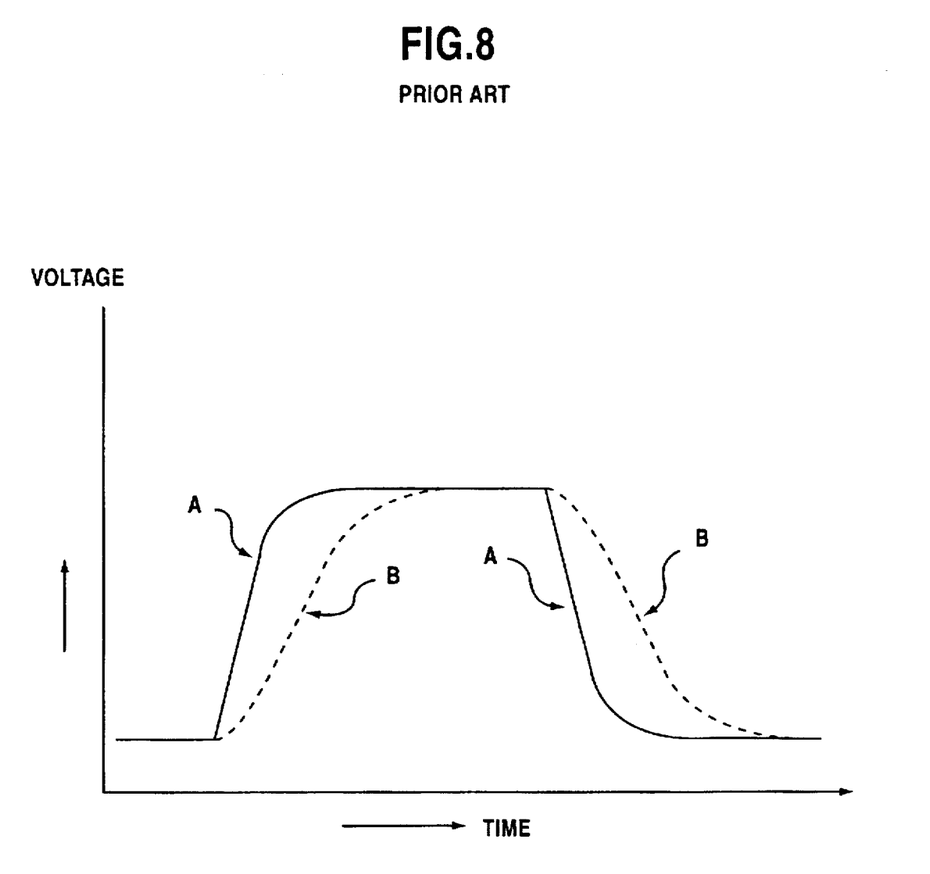
FIG. 8 is a graph of the signal waveform at point A, which is close to the output side of the driver circuit 20 of the wire 100, and of the signal waveform at point B, which is close to the distal end on the opposite side.

FIG. 8 is a graph illustrating the signal waveform at point A, which is close to the output side of the driver circuit 20 of the wire 100, and the signal waveform at point B, which is close to the distal end on the opposite side. At point A, which is close to the driver circuit 20, the waveform is relatively sharp, as indicated by the solid line in the figure, but at point B, which is on the distal end side of the wire 100, the waveform is considerably flattened, as indicated by the broken line in the figure. This phenomenon is more pronounced the greater is the number of the controlled circuits 30 and the longer is the wire 100. Specifically, the bluntness of the waveform becomes more pronounced as the CR time constant of the wire increases. Therefore, the drive of the controlled circuit 31 positioned nearest point A in FIG. 7 is controlled at a timing equivalent to the output of the signal generation circuit 10, but the drive of the controlled circuit 36 positioned nearest point B is controlled at a timing that is considerably delayed.

When, for example, there is a need for the drive control signals to control the drive of the controlled circuits only for a short period, the timing of the control period will vary between the controlled circuits 31 and 36, and this is undesirable in terms of high-speed control within the device.

SUMMARY OF THE INVENTION

In view of this, an object of the present invention is to solve the above-mentioned problems encountered in the past and provide a drive circuit in which the delay in the propagation of the drive control signals is eliminated.

Another object of the present invention is to provide a semiconductor memory device that has a drive circuit in which the propagation delay of the drive control signals of the word line drive circuits is eliminated.

In order to achieve the stated objects, the drive circuit of the present invention comprises:

a signal generation circuit which generates a drive signal at a specific timing;

a first driver circuit which drives one end of a first wire connected to a plurality of controlled circuits in response to said drive signal;

a second driver circuit which drives one end of a second wire having a smaller drive load than said first wire in response to said drive signal; and a high speed driver circuit which has its inputs connected to the other end of said second wire and to the other end of said first wire, and which has an output terminal that drives the other end of said first wire when the voltage level at the other end of said second wire does not coincide with the voltage level at the other end of said first wire.

By using the second wire as a bypass wire, providing the drive signals to the high speed driver circuit without any delay, and having the high speed driver circuit drive the first wire accordingly, it is possible to minimize the propagation delay of the drive signals supplied by the first wire which has a large drive load.

The present invention is further characterized in that the high speed driver circuit has a pull-up transistor that pulls up the other end of the first wire, and a pull-down transistor that pulls down the same, the pull-up transistor pulls up the other end of the first wire when the other end of the first wire is at a low voltage level L and when the other end of the second wire is at a high voltage level H; and the pull-down transistor pulls down the same when the other end of the first wire is at the high voltage level H and when the other end of the second wire is at the low voltage level L.

In order to achieve the above objectives, another invention is a semiconductor memory device having a plurality of word lines, a plurality of bit lines, and a plurality of memory cells positioned at the intersections therebetween, comprises:

a plurality of word line drive circuits that are connected to the word lines and that drive the word lines;

a drive signal generation circuit which generates word line drive control signal whose pulse width is shorter than the address cycle of the memory; device a first wire which is positioned along the plurality of word line drive circuits and which supplies the word line drive control signal to the word line drive circuits;

a first driver circuit which drives one end of the first wire in response to the word line drive control signal;

a second wire which is positioned along the first wire and which has a smaller drive load than the first wire;

a second driver circuit which drives one end of the second wire in response to the word line drive control signal; and a high speed driver circuit which has its inputs connected to the other end of the second wire and to the other end of the first wire, and which has an output terminal that drives the other end of the first wire when the voltage level at the other end of the second wire does not coincide with the level at the voltage other end of the first wire.

With a structure such as this, the plural word line driver circuits are driven at roughly the same timing.

DESCRIPTION OF THE PREFERRED EMBODIMENTS

An embodiment of the present invention will now be described through reference to the figures. This embodiment does not, however, serve to limit the technological scope of the present invention.

Figure 1:
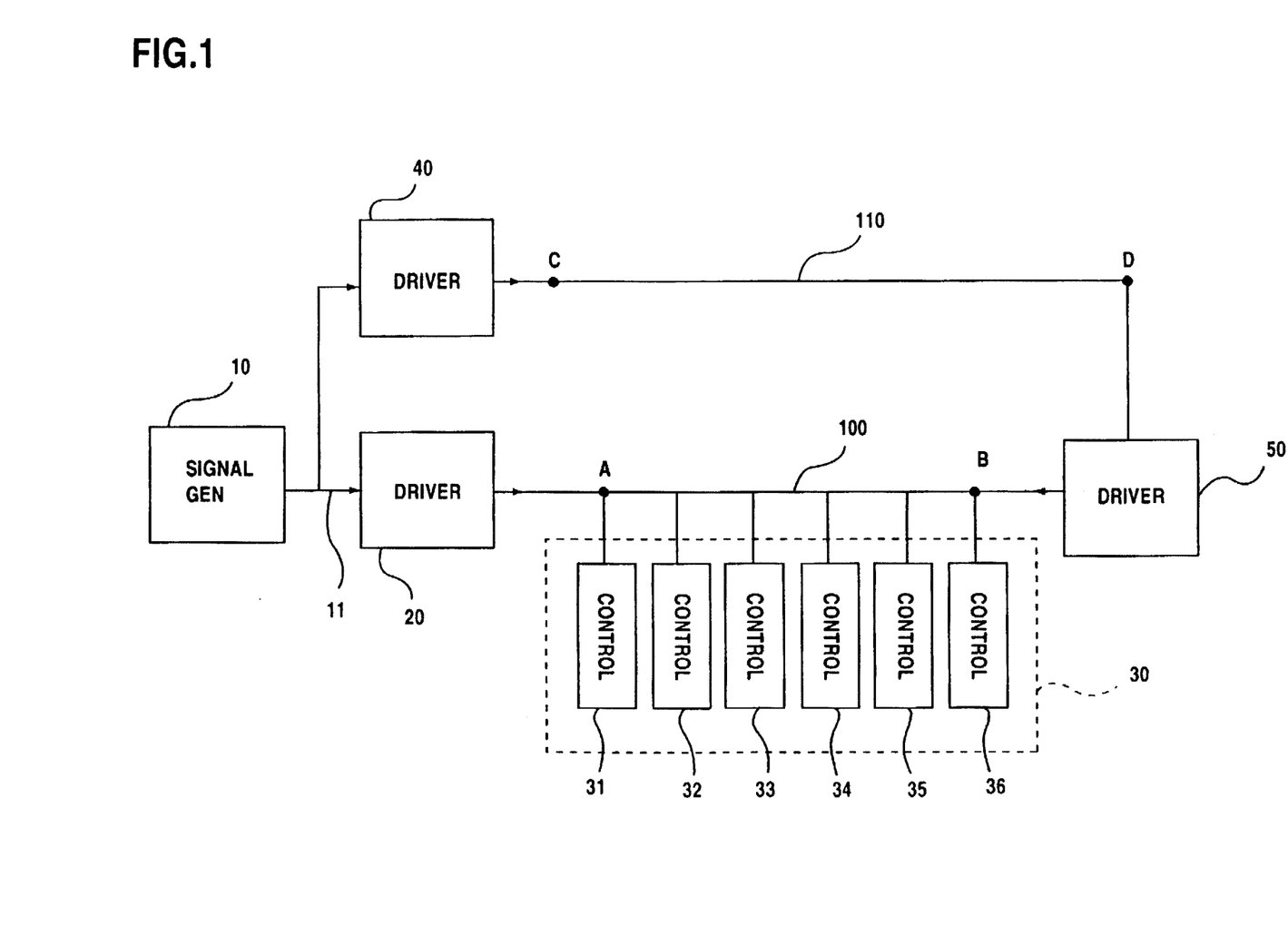
FIG. 1 is a principle diagram of the drive circuit in this embodiment.

FIG. 1 is a principle diagram of the drive circuit in this embodiment. In this example, aside from the wire 100 to which a plurality of controlled circuits 31–36 are connected, a second wire 110 that has a lighter drive load than the wire 100 is also provided, and this second wire 110 is driven from one side by a driver circuit 40. Therefore, the signals from the driver 40 propagate without delay from point C to point D. Also, a high speed driver circuit 50 is provided to the other side of the second wire 110, and drives the other end of the first wire 100 in response to the signals that have propagated without delay.

This high speed driver circuit 50 is operated in order to make up for the delay in the signal propagation of the point B portion of the first wire 100, and in particular, operates so that the other end of the first wire 100 is driven when the signal level of the point B portion of the first wire 100 is different from the signal level of the point D portion of the second wire 110. Therefore, the high speed driver circuit 50 perform the drive operation only at the transition state.

Figure 2:
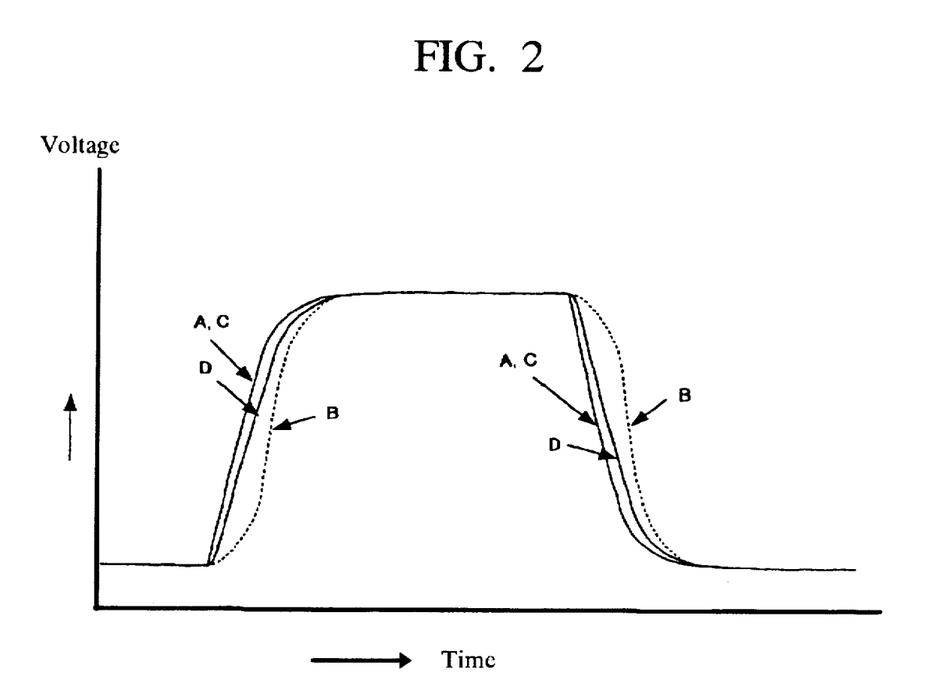
FIG. 2 is a graph of the signal waveform at various points, and is used to illustrate the operation of the drive circuit in FIG. 1.

FIG. 2 is a graph of the signal waveform at various points, and is used to illustrate the operation of the drive circuit in FIG. 1. As discussed above, the controlled circuits 31–36 are not connected to the second wire 110, and because of the device structure, the second wire 110 has low resistance, and is structured so that the overall load will be smaller than that of the first wire 100. Therefore, the signals provided to the second wire 110 by the driver circuit 40 rise and fall with almost no delay time between points C and D. Meanwhile, the signals provided to the first wire 100 by the driver circuit 20 rise and fall at point A at a timing equivalent to that of point C. Although there is some delay at point B, since the wire 100 is driven in response to the signals at point D by the high speed driver circuit 50, there is none of the leveling off of the rise and fall as in the past, and signals with a relatively sharp leading and trailing edge are obtained at the point B.

Figure 3:
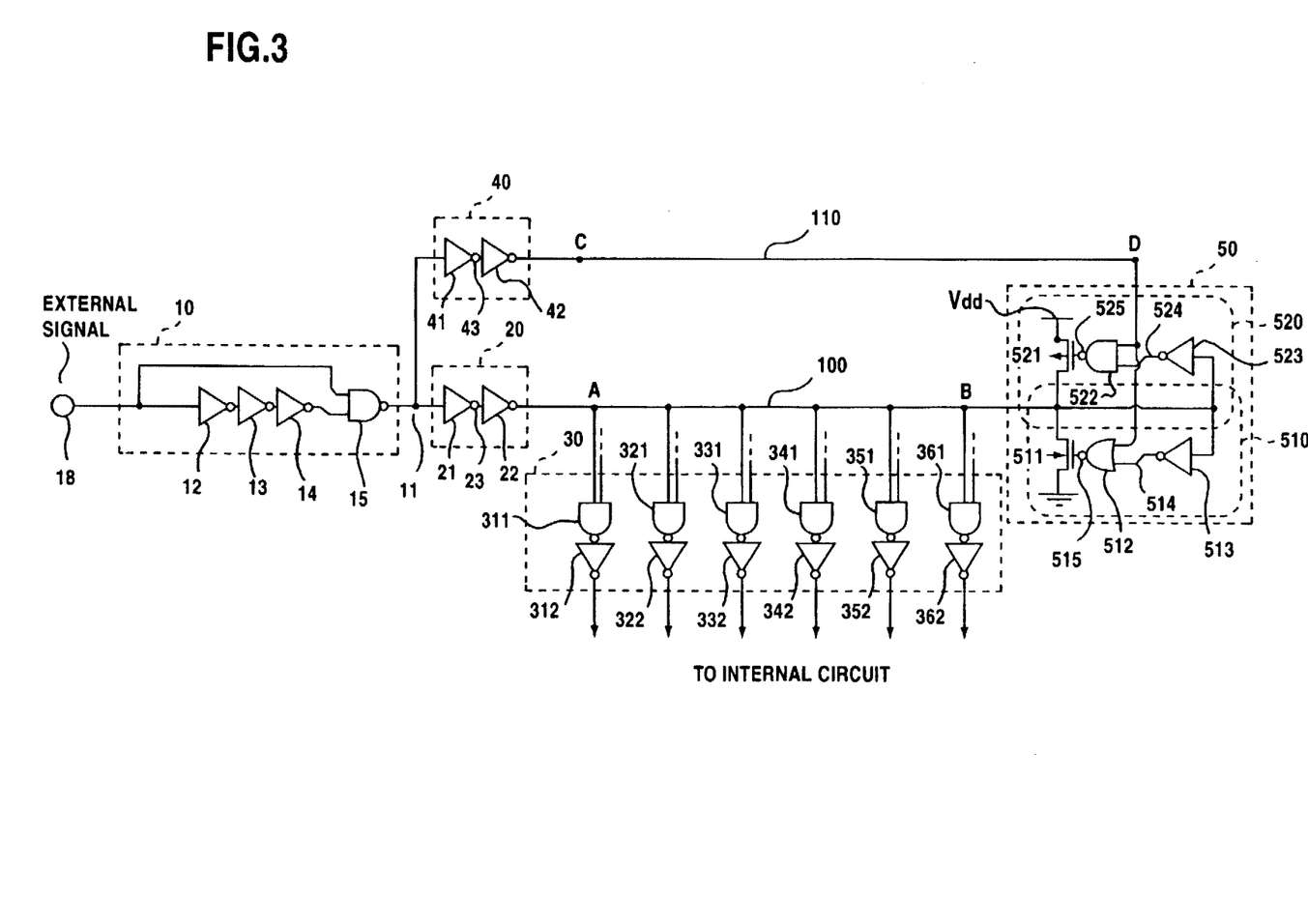
FIG. 3 is an example of a detailed circuit diagram of the drive circuit in this embodiment.

FIG. 3 is an example of a detailed circuit diagram of the drive circuit in this embodiment. The generation circuit 10 for the drive control signals detects the leading edge of an external signal 18, and generates a pulse signal 11 having a width equivalent to the delay time of the three-stage inverter circuits 12, 13, and 14. The first driver circuit 20 is provided with the drive control signal 11 generated by the signal generation circuit 10, and transmits this drive control signal to the first wire 100. The structure of the driver circuit 20 comprises two inverter circuits 21 and 22. The second driver circuit 40 is provided with the drive control signal 11 generated by the signal generation circuit 10, and transmits the drive control signal to the second wire 110. The structure of the driver circuit 40 comprises two inverter circuits 41 and 42.

In this example, the controlled circuits 30 to which the drive control signals 11 are provided via the first wire 100 comprise NAND gates 311 through 361 and inverters 312 through 362. The first wire 100 is connected to the input terminal of one of these NAND gates. Control signals are provided as needed to the input terminals of the other NAND gates.

In the example of a drive circuit shown in FIG. 3, a detailed circuit example of the high speed driver circuit 50 is illustrated. This high speed driver circuit comprises a pull-down circuit 510 and a pull-up circuit 520. The pull-down circuit 510 has a pull-down N-type MOS transistor 511 that drives the first wire 100, a NOR gate 512, and an inverter 513. The other end (the point B side) of the first wire 100 is provided as input to the inverter 513. The other end (the point D side) of the second wire 110 and the outputs of the inverter 513 are provided as inputs to the NOR gate 512.

The pull-up circuit 520 has a pull-up P-type MOS transistor 521 that drives the first wire 100, a NAND gate 522, and an inverter 523. The other end (the point B side) of the first wire 100 is provided as input to the inverter 523. The other end (the point D side) of the second wire 110 and the output of the inverter 523 are provided as inputs to the NAND gate 522.

Figure 4:
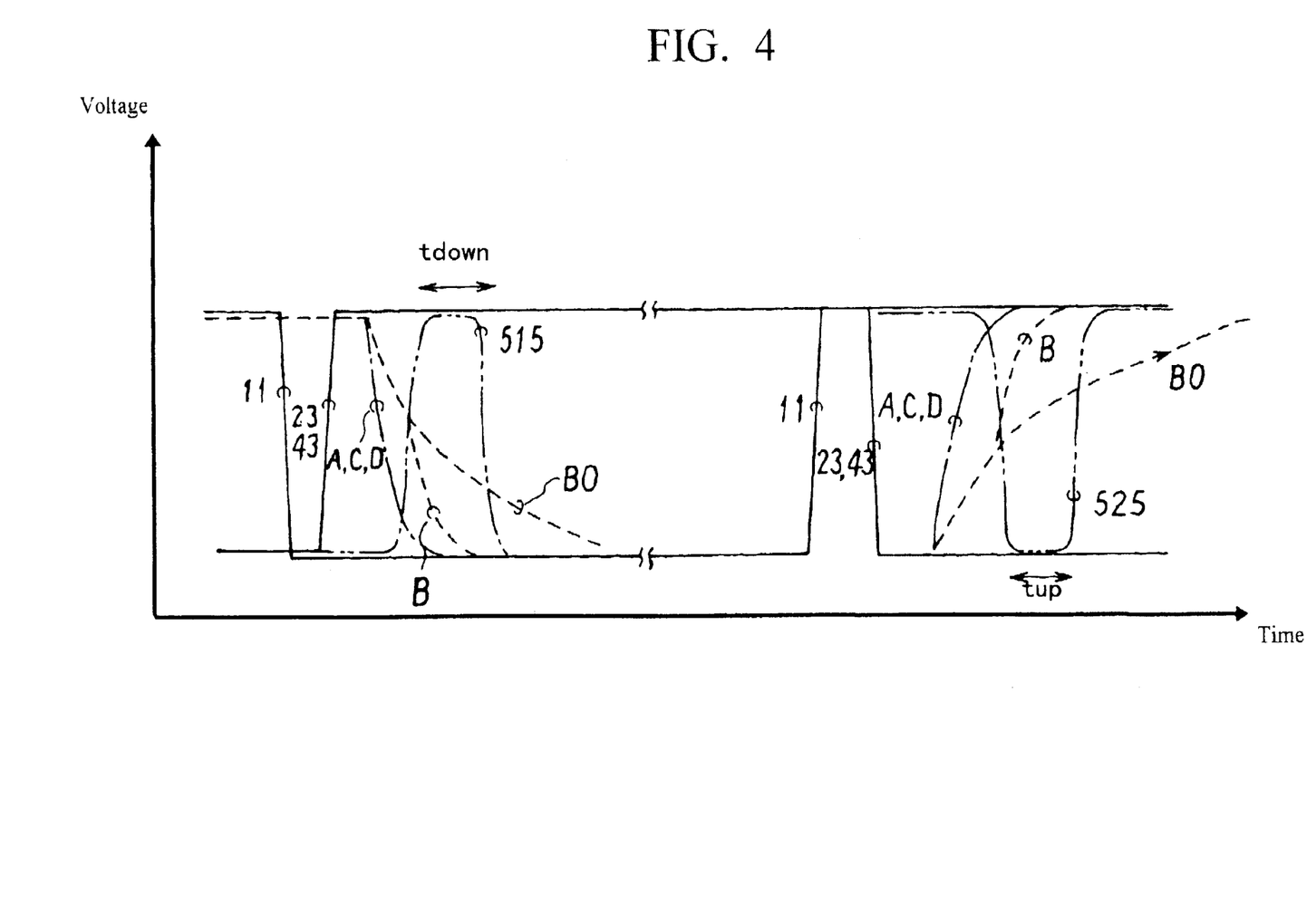
FIG. 4 is a graph showing the signal waveforms of the various components in FIG. 3 for the trailing edge and leading edge of the drive control signal 11.

FIG. 4 is a graph showing the signal waveforms of the various components in FIG. 3 for the falling edge and rising edge of the drive control signal 11. The operation will now be described for a case in which the drive control signal 11 is falling. As shown in FIG. 4, the outputs 23 and 43 of the inverters 21 and 41 rise with a delay equivalent to one stage of the inverter in response to the fall of the drive control signal 11. Therefore, points A and C, which are close to the first and second driver circuits 20 and 40, fall with a delay equivalent to the inverters 22 and 42. At this time, the signal falls with almost no delay at point D of the second wire 110 as well, which has a light load.

However, because of the large load of the first wire 100, the signal level at point B remains at the high voltage level H at the point in time. Therefore, the output 514 of the inverter 513 is at low voltage level L, and since the signal level at point D is at the low voltage level L, the output 515 of the NOR gate 512 temporarily changes to the low voltage level H. Since this output 515 is at the low voltage level H, the pull-down N-type transistor 511 conducts electricity and drops the voltage level at the other end (the point B side) of the first wire 100. Therefore, the signal level at point B falls sharply as a result of this high speed driver circuit 50, as indicated by B in FIG. 4, which is in contrast to the flatter fall characteristics indicated by the conventional BO.

Therefore, the operation of the NAND gate 311 that is drive-controlled by the signal at point A, and the NAND gate 361 that is drive-controlled by the signal at point B is accompanied by only a very slight delay. Also, as the signal level of point B falls off sharply, the output 514 of the inverter 513 rises and causes the output 515 of the NOR gate 512 to fall. As a result, the pull-down transistor 511 stops conducting.

Specifically, the pull-down transistor 511 merely conducts excessively as a result of the pulse signal generated at the node 515 for just the period "tdown" shown in FIG. 4. Therefore, the high speed driver circuit 50 does not compete with the driver circuit 20 that drives the first wire 100 when the node 11 subsequently reaches high voltage level H, and consequently, there is no through current that flows from the power source toward ground.

Next, the operation of the drive circuit when the drive control signal 11 is rising will be described. First, when the drive control signal 11 rises, there is a delay before the inverter outputs 23 and 43 fall. This is accompanied by a rise in point A of the first wire 100 and in points C and D of the second wire 110. At this time, since the signal level at point B of the first wire 100 is still at a low voltage level L, the output 524 of the inverter 523 is still at a high voltage level H. Thus, the signal at point D is also at the high voltage level H, the output 525 of the NAND gate 522 falls, the P-type pull-up transistor 521 conducts, and the voltage level at the other end (the point B side) of the second wire 100 is pulled up. Therefore, point B rises sharply. As shown in FIG. 4, the rise characteristics are sharp as indicated by B, rather than the gentler rise characteristics indicated by the conventional BO.

After this, the rise in point B is accompanied by a fall in the output 524 of the inverter 523, the output 525 of the NAND gate 522 reaches the H voltage level, and the P-type transistor 521 stops conducting. Specifically, the P-type transistor 521 conducts excessively as a result of the negative pulse signal generated at the output 525 during the period "tup" in FIG. 4, and the voltage level on the other side of the first wire 100 is pulled up. In a steady state, the P-type transistor 521 is still off, so there is no competition with the driver circuit 20 that drives the wire 100 when the node 11 subsequently reaches the low voltage level L, and consequently, there is no through current that flows from the power source toward ground.

As discussed above, there is a very slight delay in the signals at points A and B of the first wire 100, but since the rise and fall characteristics are both sharp, the NAND gates 311 and 361 of the controlled circuits that are thereby drive-controlled operate with almost no delay.

Figure 5:
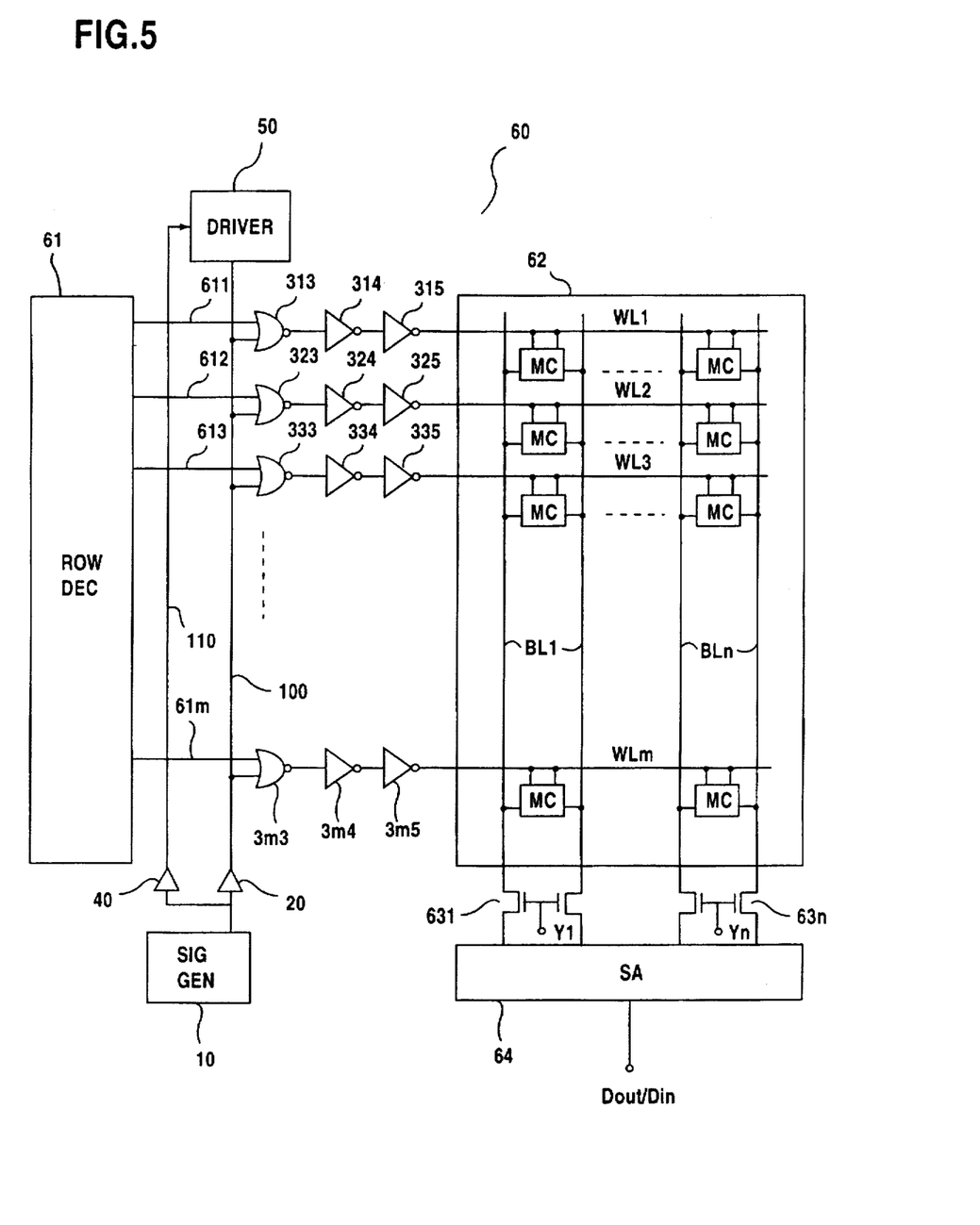
FIG. 5 is an overall structure diagram of a semiconductor memory device that operates by a clocked word system that has a drive circuit.
Figure 6:
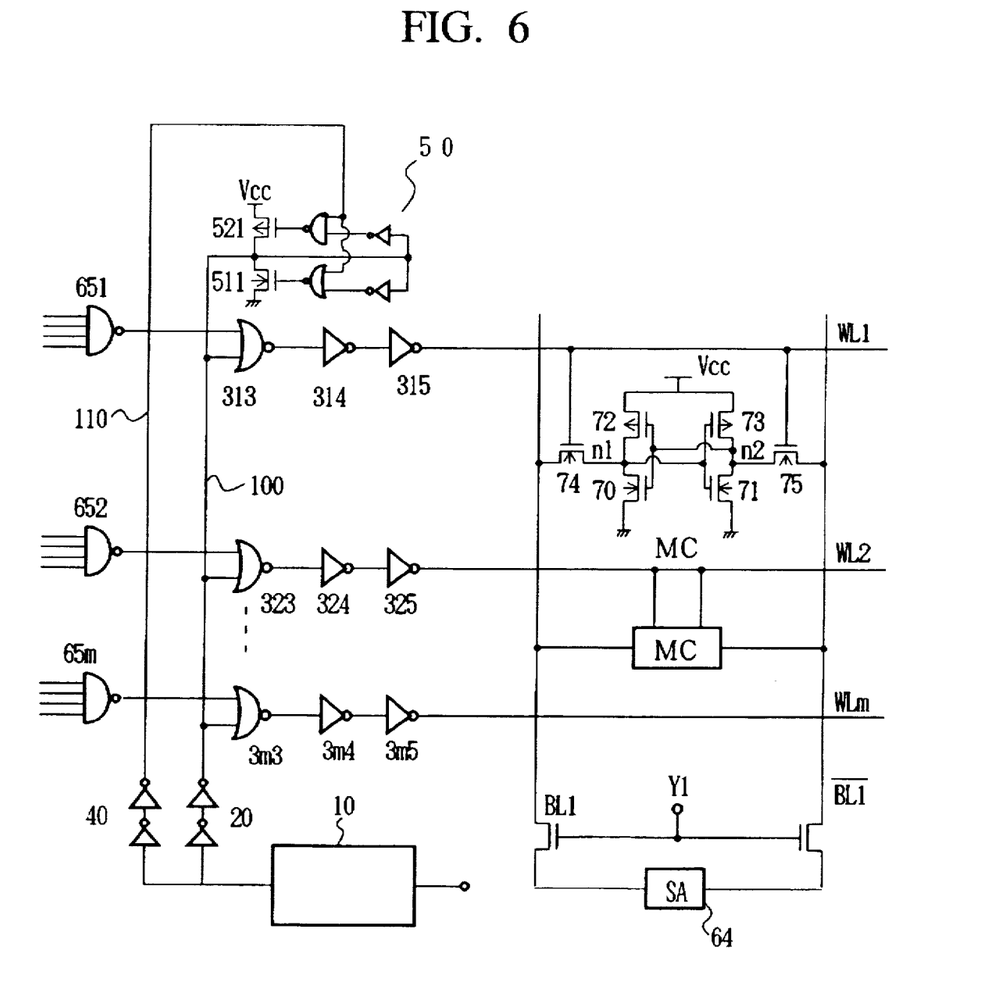
FIG. 6 is a detailed diagram of the semiconductor memory device in FIG. 5.

FIG. 5 is an overall structure diagram of a semiconductor memory device that operates by a clocked word system that has the above described drive circuit. FIG. 6 is a detail view thereof. The semiconductor memory device 60 shown in FIG. 5 is an example of a static memory. Word lines WL1 through WLm are selected by the output of a row decoder 61, which decodes row addresses, and by the output of the generation circuit 10 for the drive control signal. Positioned within a memory cell array 62 are the plurality of word lines WL1 through WLm, and a plurality of bit line pairs BL1 through BLn that intersect these word lines. Memory cells MC are provided at these intersecting portions.

The bit line pairs BL are connected to a sense amplifier 64 via column selection gates 631 through 63n. An input/output terminal Dout/Din is connected to the sense amplifier 64. Y1 through Yn are column selection signals, and are the output of a column decoder (not shown).

In this memory, the various word lines are selected by the respective word driver circuits. For instance, the word line WL1 is driven by word driver circuits 313, 314, and 315. Similarly, the word line WL2 is driven by word driver circuits 323, 324, and 325.

These word driver circuits correspond to the controlled circuits described in FIGS. 1 and 3. These word driver circuits operate at the timing of the drive control signals that are generated by the drive control signal generation circuit 10 and that are sent to the first wire 100 by the driver circuit 20. Therefore, a single word line is selected by the row decoder 61, and the word line rises by a specific period at the timing of the drive control signal provided to the first wire 100. For example, if the drive control signal is provided to the first wire 100 for only a small portion of the period of one cycle, then the word line will rise to the selected voltage level for only this very short period.

This first wire 100 is a wire that extends along the word line drive circuit toward the column, and numerous word drive circuits are connected. Therefore, the load thereof increases. In view of this, the voltage second wire 110 is positioned parallel to the first wire 100, one end thereof is driven by the driver 40, and the other end of the first wire 100 is driven by the high speed driver circuit 50 provided to the other end of the second wire 110. As discussed above, this high speed driver circuit 50 drives the other end of the first wire 100 only during the period when the other end of the first wire 100 has yet to rise, and during the period when it has yet to fall. Therefore, the timing of the operation of the word driver circuits is roughly the same.

An example of a detailed circuit diagram of the memory cells is shown in FIG. 6. These memory cells MC consist of 6 transistors. CMOS inverters comprising N-type transistors 70 and 71 and P-type transistors 72 and 73 are connected such that they intersect with gates and drains, respectively. The memory cells are connected to the bit line pair BL1 by N-type transistors 74 and 75. The word lines WL are driven to the selected level only during the above-mentioned partial period, which results in the transistors 74 and 75 of the memory cells MC conducting electricity only during this partial period.

When the transistors 74 and 75 conduct, one of the transistors 70 and 71 and one of the transistors 72 and 73 of the memory cells in which data are stored drive the bit lines BL, /BL, and the sense amplifier 64 detects this. Therefore, the inflow of current from the transistor 74 or 75 results in instability in the level of the node n1 or n2 that was at the voltage level H or L according to the stored data, and if the word lines are set to the selected voltage level over an extended period, this can lead to inversion of the stored data. Consequently, it is better to shorten as much as possible the period during which the word lines one set to the selected voltage level and the transistors 74 and 75 conduct electricity. Further, if the bit lines are driven a certain amount by the transistors 70, 71, 72, and 73 of the memory cells, this can be detected by the sense amplifier 64. In this case, the power consumed by the bit line drive of the memory cells can be minimized by driving for only the minimum required period. It is for this reason that the word lines are driven by the above-mentioned clocked word system.

After the selected memory cells have driven the bit lines, this state is detected by the sense amplifier 64 and output to an external component. Accordingly, the timing at which the plurality of word lines are driven must be synchronized as much as possible. Utilization of the drive circuit illustrated in the embodiment of the present invention allows the drive control signals to be supplied through the first wire 100 to the word line drive circuits at roughly the same timing.

651, 652, and 65m in FIG. 6 are line decoder circuit examples, and the outputs thereof are provided to the NOR gates 313, 323, and 3m3 of the word driver circuit.

Since the first wire 100 is connected to a plurality of word driver circuits, the drive load thereof is large. On the other hand, the second wire 110 is constructed such that the drive load is as small as possible in order to drive the high speed driver circuit 50 as fast as possible. For example, the wiring on the lower layer side of a semiconductor device generally comprises a relatively thin wiring layer. The purpose of this is to minimize the irregularities on the upper surface when multiple layers are formed. In view of this, it is preferable for the first wire 100 to be the wiring layer on the lower layer side, and for the second wire 110 to be the wiring lay on the upper layer side.

Alternatively, the second wiring structure may be composed of a material whose resistance is lower than that of the first wire. Furthermore, if required, the drive transistors may be larger in size in order to increase the drive capability of the driver circuit 40 that drives the second wire 110.

As described above, with the present invention, a second wire is provided in addition to the first wire that supplies drive control signals to a plurality of controlled circuits, one end of the second wire is driven by a driver circuit just as with the first wire, and a high speed driver circuit provided to the other end of the second wire allows the other end of the first wire to be driven only during the period when the voltage level of the other end of the second wire is different from the voltage level of the other end of the first wire. Therefore, drive control signals can be provided from the first wire at a low power consumption rate and at roughly the same timing to the plurality of controlled circuits.

When the above-mentioned drive circuit is utilized in a clocked word system for memory cells, it is possible to provide a semiconductor memory device in which the power consumption is low and the inversion of stored data is prevented.

What is claimed is:

1. A drive circuit comprising:
   a signal generation circuit which generates a drive signal at a specific timing;
   a first driver circuit which drives one end of a first wire connected to a plurality of controlled circuits in response to said drive signal;
   a second driver circuit which drives one end of a second wire having a smaller drive load than said first wire in response to said drive signal; and
   a high speed driver circuit which has its inputs connected to the other end of said second wire and to the other end of said first wire, and which has an output terminal that drives the other end of said first wire when the voltage level at the other end of said second wire does not coincide with the voltage level at the other end of said first wire.

2. A drive circuit as defined in claim 1, wherein said high speed driver circuit has a pull-up transistor that pulls up the other end of said first wire, and a pull-down transistor that pulls down the same, wherein said pull-up transistor pulls up the other end of said first wire when the other end of said first wire is at a low voltage level and when the other end of said second wire is at a high voltage level, and wherein said pull-down transistor pulls down the same when the other end of said first wire is at the high voltage level and when the other end of said second wire is at the low voltage level.

3. A semiconductor memory device having a plurality of word lines, a plurality of bit lines, and a plurality of memory cells positioned at the intersections therebetween, said semiconductor memory device comprising:
   a plurality of word line drive circuits that are connected to said word lines and that drive said word lines;
   a drive signal generation circuit which generates a word line drive control signal whose pulse width is shorter than the address cycle of the memory device;
   a first wire which is positioned along said plurality of word line drive circuits and which supplies said word line drive control signal to said word line drive circuits;
   a first driver circuit which drives one end of said first wire in response to said word line drive control signal;
   a second wire which is positioned along said first wire and which has a smaller drive load than said first wire;
   a second driver circuit which drives one end of said second wire in response to said word line drive control signal; and
   a high speed driver circuit which has its inputs connected to the other end of said second wire and to the other end of said first wire, and which has an output terminal that drives the other end of said first wire when the voltage level at the other end of said second wire does not coincide with the voltage level at the other end of said first wire.

4. A semiconductor memory device as defined in claim 3, wherein said high speed driver circuit has a pull-up transistor that pulls up the other end of said first wire, and a pull-down transistor that pulls down the same, wherein said pull-up transistor pulls up the other end of said first wire when the other end of said first wire is at a low voltage level and when the other end of said second wire is at a high voltage level, and wherein said pull-down transistor pulls down the same when the other end of said first wire is at the high voltage level and when the other end of said second wire is at the low voltage level.

5. A semiconductor memory device as defined in claim 3, wherein said word line drive circuits input the word line drive control signal supplied via said first wire and the output signals from a decoder circuit of the word lines, and drive the selected word line at the timing of said word line drive control signal.

* * * * *